(12) United States Patent
Nachimuthu et al.

(10) Patent No.: US 9,256,493 B2
(45) Date of Patent: Feb. 9, 2016

(54) MEMORY MODULE ARCHITECTURE

(75) Inventors: Murugasamy K. Nachimuthu, Beaverton, OR (US); Mohan J. Kumar, Aloha, OR (US); Debaleena Das, Los Gatos, CA (US); Dimitrios Ziakas, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 105 days.

(21) Appl. No.: 13/993,506

(22) PCT Filed: Dec. 28, 2011

(86) PCT No.: PCT/US2011/067496
§ 371 (c)(1),
(2), (4) Date: Jun. 12, 2013

(87) PCT Pub. No.: WO2013/100939
PCT Pub. Date: Jul. 4, 2013

(65) Prior Publication Data
US 2014/0195876 A1      Jul. 10, 2014

(51) Int. Cl.
*G06F 11/10*    (2006.01)
*G11C 5/04*     (2006.01)
*G11C 13/00*    (2006.01)

(52) U.S. Cl.
CPC ........ *G06F 11/1044* (2013.01); *G06F 11/1064* (2013.01); *G11C 5/04* (2013.01); *G11C 13/0004* (2013.01)

(58) Field of Classification Search
CPC ..................................................... H04L 1/0057
USPC .......... 714/752, 766, 718, 733, 763, 757, 773
See application file for complete search history.

(56) References Cited

U.S. PATENT DOCUMENTS

| | | | | |
|---|---|---|---|---|
| 5,255,383 | A  * | 10/1993 | Lewis et al. .................... | 713/600 |
| 5,825,697 | A  * | 10/1998 | Gilliam et al. ................. | 365/200 |
| 7,308,621 | B2 * | 12/2007 | Adams et al. .................. | 714/718 |
| 7,836,375 | B2   | 11/2010 | Ariyama | |
| 8,015,473 | B2   |  9/2011 | Eilert | |
| 8,156,398 | B2   |  4/2012 | Sommer | |
| 8,230,300 | B2   |  7/2012 | Perlmutter | |
| 8,516,339 | B1 * |  8/2013 | Lesea et al. .................... | 714/763 |
| 2008/0301256 | A1 * | 12/2008 | McWilliams ....... | G06F 12/0284 709/214 |
| 2011/0208900 | A1 | 8/2011 | Schuette | |

OTHER PUBLICATIONS

PCT International Search Report and Written Opinion issued in corresponding PCT/US2011/067496 dated Sep. 21, 2012 (10 pages).

* cited by examiner

*Primary Examiner* — Fritz Alphonse
(74) *Attorney, Agent, or Firm* — Trop, Pruner & Hu, P.C.

(57) ABSTRACT

In accordance with some embodiments, memory modules containing phase change memory elements may be organized so that each memory integrated circuit includes both data and error correcting code. As a result of including the error correcting code in each integrated circuit, extra accesses of the memory module to extract the error correcting code can be avoided, improving the performance of the overall memory module in some embodiments.

23 Claims, 3 Drawing Sheets

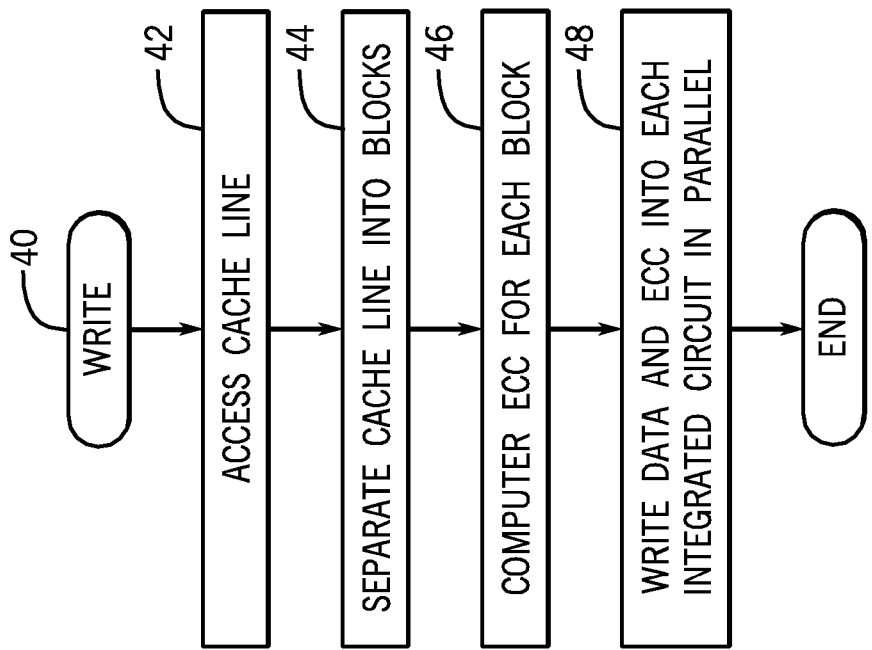

MEMORY MODULE ARCHITECTURE

BACKGROUND

This relates generally to memory modules.

A memory module typically includes a plurality of integrated circuit memories. Memory modules typically include either non-volatile memory integrated circuits or dynamic random access memory (DRAM) integrated circuits. In DRAM memory integrated circuits in memory modules, single or multiple errors are isolated to one single integrated circuit in the module. In non-volatile memory modules, such as phase change memory modules, errors may not be isolated to a single device. Multiple integrated circuits in the module can contain errors.

Thus, an error correction scheme in non-volatile memories needs to not only correct for multiple errors across multiple devices in the module but also to protect against any one of the devices failing completely. Memory integrated circuits may be built for 16-byte wide accesses. Given that cache line accesses require 64 bytes of data, a reliability scheme in a memory module with four memory integrated circuits plus one exclusive OR device requires two accesses. The first access is 16-byte wide access for data. The second access is one 16-byte wide access to access error correction bytes. The exclusive OR device protects against complete failure of a device.

BRIEF DESCRIPTION OF THE DRAWINGS

FIG. 3 shows a cache line access of the memory module shown in FIG. 2;

FIG. 4 is a flow chart for writing in one embodiment; and

DETAILED DESCRIPTION

In accordance with some embodiments, non-volatile memory modules may include a plurality of memory integrated circuits, each storing both data and error correcting code. As a result of including the error correcting code in each integrated circuit, extra accesses of the memory module to extract the error correcting code can be avoided, improving the performance of the overall memory module in some embodiments.

For example, with a conventional processor cache line size of 64 bytes, the memory module may be composed of four memory chips that support access at granularity of 16 bytes provided in a common package. In such case, there is only enough room for the data and no room, within each chip, for error correcting code or metadata. In other words, if the processor wants 64 bytes of data at a time, four chips can provide 64 bytes, if each chip has a 16 byte access granularity, but only if data and the error correcting code and metadata are accessed separately in two sequential accesses to the devices. The typical metadata fields contain information about additional details about the cache line data state such as data is corrupted (poisoned) or invalid or corrected errors count for a given cache line or error on read or write, source of error, tag bits, etc.

If, instead, five integrated circuits of 16 byte access granularity are included in a memory module, about three bytes may be reserved for error correcting code in each integrated circuit. Then, in a single parallel access that sweeps across all five memory integrated circuits a cache line of 64 bytes of data (that processors currently operate on) can be extracted, together with about 15 bytes of error correcting code.

Typically, an extra or sixth integrated circuit may also be provided as an exclusive OR device. This means that in the illustrated example with 16-byte access granularity integrated circuits and 64 byte cache lines, six integrated circuits may be packaged in one memory module. Of course, with other integrated circuit sizes and other cache line access sizes, other architectures may be used.

Figure 1:
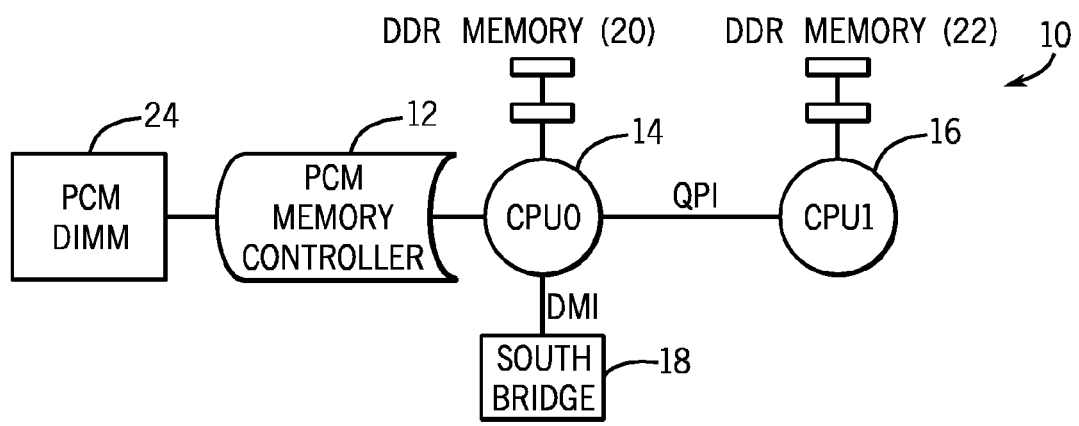
FIG. 1 is a system depiction for one embodiment of the present invention.

Referring to FIG. 1, a computer system 10 may include two processors 14 and 16 in one embodiment. Each processor may include Double Data Rate (DDR) memory 20 or 22. A high speed interconnect may connect the processors 14 and 16 in one embodiment. For example, an Intel Quick Path Interconnect (QPI) may be used in one embodiment. The processor 14 may be coupled to a south bridge 18 via another interconnect such as a direct media interface (DMI).

The processors may be coupled to a memory controller 12 that connects to one or more phase change memory modules 24. In some cases, more than one memory module may be coupled to the memory controller 12. In some embodiments, the memory integrated circuitry may be phase change memory.

Figure 2:
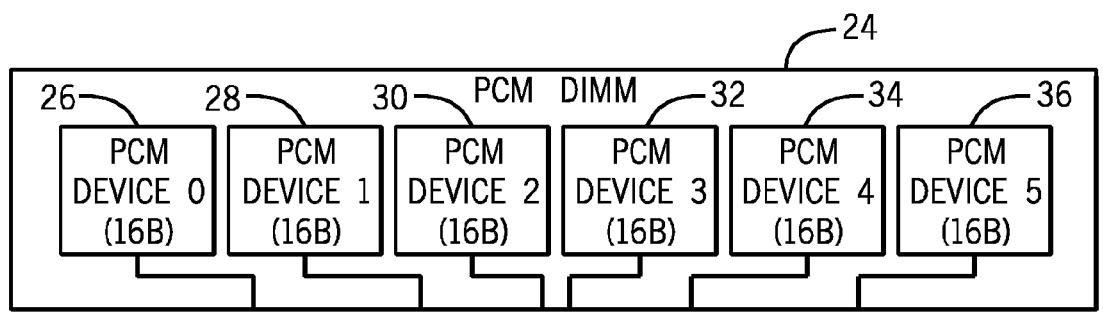
FIG. 2 is a schematic depiction of a memory dual in-line memory module in accordance with one embodiment of the present invention.

As shown in FIG. 2, in accordance with an embodiment with 64 byte cache line size and 16 byte access granularity memory integrated circuits, a memory module 24 may include six integrated circuits 26, 28, 30, 32, 34, and 36. The circuit 36 includes an exclusive OR device. The memory integrated circuits (not including the exclusive OR device) may each allow access to about 13 bytes of data and three bytes of error correcting code in one embodiment.

Then, as shown in FIG. 3, a single cache line may be extracted, corresponding to about 64 bytes of data, by accessing five memory integrated circuits in parallel, yielding 15 bytes of error correcting code, and exclusive OR recovery bits.

Typically, non-volatile memory integrated circuits each implement per-device error correcting code. Providing error correcting code in each integrated circuit allows recovery from device failure through an additional device called an exclusive OR device 36. Given that memory integrated circuits may be built for 16 byte accesses, and a cache line may involve 64 bytes, to implement a reliable architecture, only one access is needed in a memory module with five memory integrated circuits and an exclusive OR device.

When data is written by the memory controller 12, the controller may take the 64 byte cache line data and separate that data into five blocks of about 13 bytes of data. The controller 12 computes about three bytes of error correcting code, as well as the exclusive OR data and error correcting code. Then all six integrated circuits may be written in parallel to complete the write operation in one embodiment.

Similarly, when data is read from the module 24, all six integrated circuits may be read in parallel and the data is separated from the error correcting code in one embodiment. The error correcting code is recomputed based on the data and compared against the error correcting code read from each memory integrated circuit to check for errors in each memory integrated circuit. Also, the exclusive OR data is compared against the exclusive OR data computed based on the data read from each phase change memory device to check for errors. If errors are found, the error is signaled and the errors are corrected before sending the data to the requesting central processing unit 14 or 16.

A sequence 40 for writing a cache line of data from a given number of integrated memory circuits may be implemented in software, firmware and/or hardware. In software and firmware embodiments it may be implemented by computer executed instructions stored in a non-transitory computer readable medium such as an optical, magnetic, or semiconductor memory. In some embodiments, the sequence may be implemented by the memory controller 12.

The sequence begins by accessing a cache line of data as indicated in block 42. Today a typical cache line of data is 64 bytes but other cache line sizes may also be used.

The cache line then is separated into a given number of blocks. For example with 16 byte access granularity memory integrated circuits, the cache line may be separated into five blocks. With other integrated circuit sizes and access granularities, different numbers of blocks may be used. After the cache line has been separated into blocks as indicated in block 44, the error correcting code may be computed for each block as indicated in block 46.

Finally the data and error correcting code may be written into each integrated circuit in parallel as indicated in block 48.

Thus, a cache line is separated into data and error correcting code bits. The data and the error correcting code bits are carried in each single memory integrated circuit and obtained in each access of a memory integrated circuit. Then all the memory integrated circuits of a memory module may be accessed, for read or write, in parallel.

Figure 5:
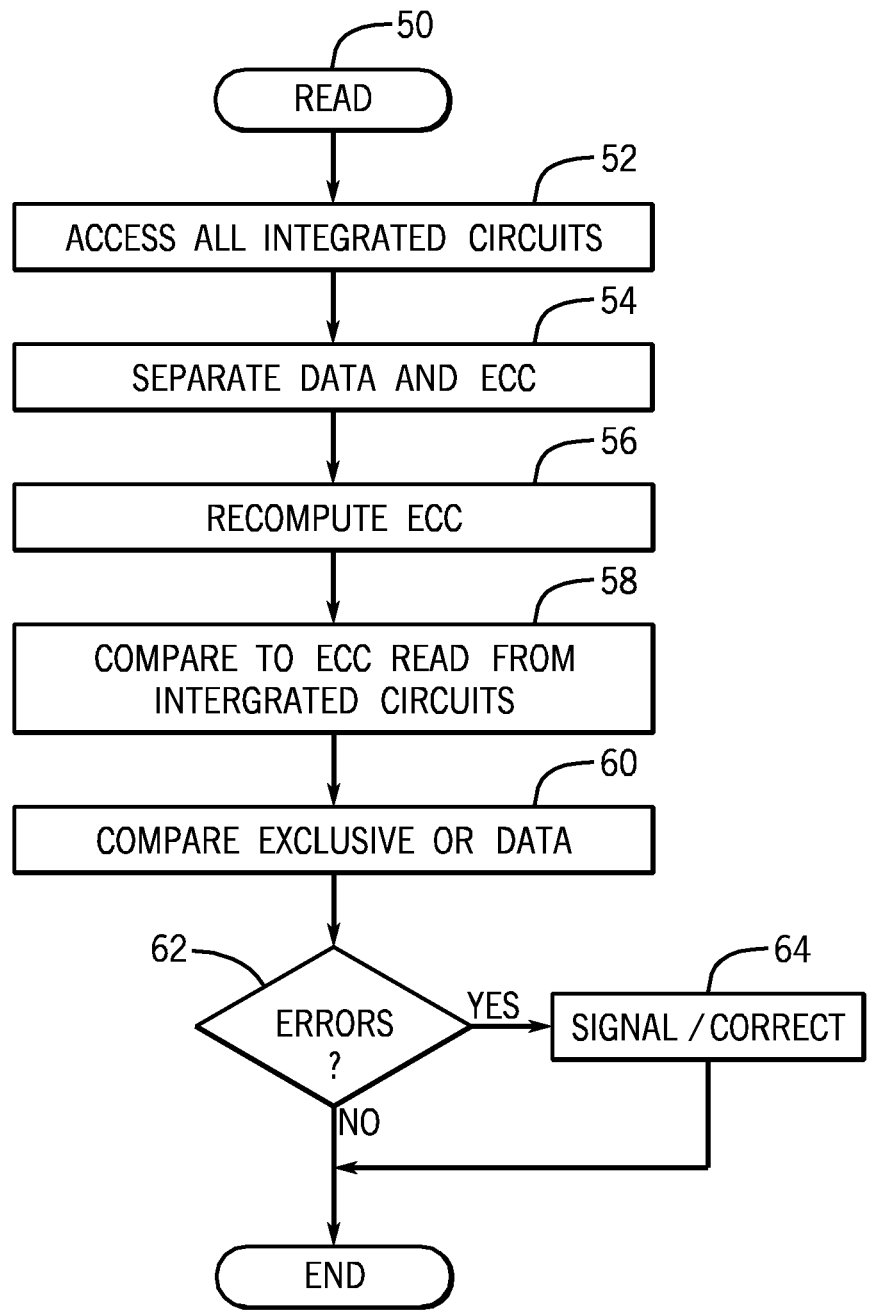
FIG. 5 is a flow chart for reading in one embodiment.

Referring to FIG. 5, a read sequence 50 may be implemented in software, firmware and/or hardware. In software and firmware embodiments it may be implemented by computer executable instructions stored in a non-transitory, computer readable medium such as an optical, magnetic or semiconductor storage.

In order to read data from a memory module, all the integrated circuits may be read in parallel as indicated in block 52. Then, data and error correcting code are separated as indicated in block 54. Error correcting code is recomputed based on the data (block 56) and compared against the error correcting code read from each integrated circuit to check for errors indicated in block 58. The exclusive OR data is compared against the exclusive OR data computed based on the data read from each memory integrated circuit to check for errors as indicated in block 60.

The decision process depicted at diamond 62 determines whether errors have been detected. If not the flow ends and the reading is complete. Otherwise, the errors may be signaled and/or corrected as indicated in block 64.

In order to read data from a memory module, all the integrated circuits within one module may be read in parallel as indicated in block 52. Then the data and error correcting code are separated as indicated in block 54. Error correcting code is recomputed based on the data (block 56) and compared against the error correcting code read from each integrated circuit to check for errors indicated in block 58. The exclusive OR data is compared against the exclusive OR data computed based on the data read from each memory integrated circuit to check for errors as indicated in block 60.

A check at diamond 62 determines whether errors have been detected. If not, the flow ends and the reading is complete. Otherwise, the errors may be signaled and/or corrected as indicated in block 64.

In one embodiment, an array of threshold-switch memory cells may be formed along address lines which may be called row lines, coupled to a row decode circuit. The cells may also be coupled to a column decode circuit via address lines which may be called column lines.

Each cell may include a stable chalcogenide material in one embodiment. In one embodiment, the chalcogenide material may be one which is generally in its amorphous phase and in operation does not change to a crystalline phase. More specifically, when exposed to 200° C. for thirty minutes or less, the chalcogenide material does not change phases, such as to a low resistance state. An Ovonic Unified Memory (OUM), such as $Ge_2Sb_2Te_5$ (GST), changes phase under these conditions.

A select or threshold device is an Ovonic Threshold Switch ("OTS") that can be made of an alloy of chalcogenide that does not switch from an amorphous to a crystalline phase and which undergoes a rapid, electric field initiated change in conductivity, a change in conductivity that persists only so long as a holding current through the device is present. Instead, through the application of appropriate programming pulses, the threshold voltage of the cell may be altered. These altered threshold voltage cells may then be detected as being in one or the other of at least two programmable states based on their threshold voltage. For added memory margin, a threshold-switch memory cell may be combined in series with an "OUM" (Ovonic Unified Memory) device or other alloy which changes phases from a low resistance to a high resistance phase and has a corresponding threshold difference between those phases.

As an example, for a 0.5 micrometer diameter device formed of TeAsGeSSe having respective atomic percents of 16/13/15/1/55, the holding current may be on the order of 0.1 to 1 micro-amps (uA) in one embodiment. Below this holding current, the device turns off and returns to the high resistance regime at low voltage, low field applied. The threshold current for the device may generally be of the same order as the holding current. The holding current may be altered by changing process variables, such as the top and bottom electrode material and the chalcogenide material, and/or the contact area between the electrodes and chalcogenide. The device may provide high "on current" for a given area of device, such as compared to conventional access devices such as metal oxide semiconductor field effect transistors or bipolar junction transistors or semiconductor diodes.

Other non-volatile memory technologies, called storage class memories, that may be used including so-called ferroelectric polymer memories, magnetorestrictive random access memory, programmable metallization cell, resistive random access memory, and nanowire-based charge trapping memory devices, to mention a few examples.

In some embodiments, the architecture described herein results in less overhead compared to memory integrated circuits that transfer only data or only error correcting code bits. Thus, overhead may be reduced, and reliability goals of conventional memory modules that require two cache line accesses to get both the data and the error correcting code may be met or exceeded, in some embodiments.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
enabling a dual in line memory module including a plurality of memory integrated circuits to store data with error correcting code on each of said memory integrated circuits.

2. The method of claim 1 including forming said memory module with an exclusive OR circuit.

3. The method of claim 1 including enabling the module to be read by accessing data and error correcting code in the same memory access.

4. The method of claim 3 including accessing the plurality of memory circuits at the same time.

5. The method of claim 4 including separating data and error correcting code.

6. The method of claim 1 including providing more memory integrated circuits in said module than are needed to store one cache line of data.

7. The method of claim 1 including enabling a phase change memory integrated circuit to store data with error correcting code.

8. A non-transitory computer readable medium storing instructions to enable a processor to enable a dual in line memory module including a plurality of memory integrated circuits to store data with error correcting code on each of said memory integrated circuits.

9. The medium of claim 8 further storing instructions to store data with error correcting code in a memory module with an exclusive OR circuit.

10. The medium of claim 8 further storing instructions to enable the module to be read by accessing data and error correcting code in the same memory access.

11. The medium of claim 10 further storing instructions to access the plurality of memory circuits at the same time.

12. The medium of claim 11 further storing instructions to separate data and error correcting code.

13. The medium of claim 8 further instructions to enable a phase change memory integrated circuit to store data with error correcting code.

14. An apparatus comprising:
a dual in line memory module including a plurality of memory integrated circuits; and
a controller, coupled to said circuit to store data with error correcting code on each of said memory integrated circuits.

15. The apparatus of claim 14 said memory module including an exclusive OR circuit.

16. The apparatus of claim 14 said module readable by accessing data and error correcting code in the same memory access.

17. The apparatus of claim 16 said plurality of memory integrated circuits being accessible at the same time.

18. The apparatus of claim 17 said controller to separate data and error correcting code.

19. The apparatus of claim 14 said module including more memory integrated circuits than are needed to store one cache line of data.

20. The apparatus of claim 14 said module including a phase change memory integrated circuit to store data with error correcting code.

21. The apparatus of claim 14 including a central processing unit coupled to said module.

22. The apparatus of claim 21 including double data error memory coupled to said processor.

23. The apparatus of claim 21 including a display coupled to said processor.

* * * * *